US009651701B2

(12) United States Patent
Kopp

(10) Patent No.: US 9,651,701 B2
(45) Date of Patent: May 16, 2017

(54) FERROMAGNETIC INCIDENT DETECTING AND LOGGING ARRANGEMENT

(71) Applicant: KOPP DEVELOPMENT INC., Jensen Beach, FL (US)

(72) Inventor: Keith Kopp, Jensen Beach, FL (US)

(73) Assignee: KOPP DEVELOPMENT, INC., Jensen Beach, FL (US)

( * ) Notice: Subject to any disclaimer, the term of this patent is extended or adjusted under 35 U.S.C. 154(b) by 71 days.

(21) Appl. No.: 14/882,919

(22) Filed: Oct. 14, 2015

(65) Prior Publication Data
US 2016/0131788 A1 May 12, 2016

Related U.S. Application Data

(60) Provisional application No. 62/076,079, filed on Nov. 6, 2014.

(51) Int. Cl.
*G01V 3/08* (2006.01)
*G01R 33/28* (2006.01)
*G01P 13/00* (2006.01)

(52) U.S. Cl.
CPC .............. *G01V 3/08* (2013.01); *G01P 13/00* (2013.01); *G01R 33/288* (2013.01)

(58) Field of Classification Search
CPC .......... G01P 13/00; G01R 33/288; G01V 3/08
USPC .................. 324/243, 244; 340/551
See application file for complete search history.

(56) References Cited

U.S. PATENT DOCUMENTS 3,697,972 A * 10/1972 Brown .................... G08B 13/24
324/232
7,113,092 B2 * 9/2006 Keene .................... G01V 11/00
324/207.26
7,489,128 B2 2/2009 Kopp
8,148,989 B2 4/2012 Kopp
2003/0171669 A1 * 9/2003 Kopp .................. G01V 3/08
600/410

(Continued)

FOREIGN PATENT DOCUMENTS

WO 2012022971 A1 2/2012

OTHER PUBLICATIONS

Extended European Search Report, Corresponding European application No. 15193190, dated Mar. 31, 2016.

*Primary Examiner* — Jay Patidar
(74) *Attorney, Agent, or Firm* — Cooper Legal Group LLC

(57) ABSTRACT

An arrangement for association with an MRI and detecting presence of ferrous material and discriminating out far field magnetic disturbance. The arrangement includes a detector configured to monitor the magnetic field and includes an array of sensors arranged about the periphery of an opening in a spaced arrangement such that each sensor is associated with a different portion of the opening. Each of the sensors is configured to output a signal having a value indicative of the sensed magnetic field at the associated portion of the opening. The arrangement includes a corrector configured to correct each signal value from the change in response to the far field magnetic disturbance and to provide respective corrected signal values. The arrangement includes a processor configured to use the corrected signal values to determine a ferrous-indicating limit is exceeded and to provide a safety response that addresses the ferrous-indicating limit exceed condition.

20 Claims, 8 Drawing Sheets

(56) References Cited

U.S. PATENT DOCUMENTS

2006/0022670 A1* 2/2006 Kumar ................ G01R 33/288
                                                      324/239
2015/0279189 A1   10/2015 Keene et al.

* cited by examiner

78 — Field Lines from Distant Ferromagnetic Object approaching Sensor Array

FERROMAGNETIC INCIDENT DETECTING AND LOGGING ARRANGEMENT

CROSS-REFERENCE TO RELATED APPLICATION

Benefit is claimed from U.S. Patent Application Ser. No. 62/076,079, filed Nov. 6, 2014, which is incorporated herein by reference.

BACKGROUND OF THE INVENTION

Field of Invention

The present invention is in the field of devices or apparatus for detecting and logging incidents of ferromagnetic objects in or on personnel and equipment in the vicinity of an operating magnetic resonance imaging (MRI) device.

Background Art

The large magnetic field of the MRI magnet will attract ferromagnetic objects in the MRI magnet's field of influence. This force of attraction can cause ferromagnetic objects to approach the MRI magnet at high velocity. The force of attraction is related to the product of the magnetic field spatial gradient (dB/dz) and the magnetic field strength B. Modern MRI machines, which have large magnetic fields and steep spatial gradients, can impart a strong force on relatively modest sized objects. It is known, for example, that a hairpin can reach speeds of 40 MPH when released near a typical 1.5 Tesla MRI.

The risk and consequent injuries from a projectile attracted are well known. In 2001, for example, a 6 year old boy was killed when a ferromagnetic oxygen cylinder was pulled into the magnet while he was being imaged. But even small objects can be dangerous. For example, an MRI patient needed to have a bobby pin surgically removed from the nasal cavity when the pin was drawn towards the center of the bore while the patient was laying head-in in the MRI. Another MRI patient forgot a fingernail clipper was in his pocket. While in the MRI magnet, he tried to remove it. The fingernail clipper slipped from his hands, and flew into his eye causing blindness. There are also life threatening risks to patients and other personnel who have implanted devices such as pacemakers, implanted defibrillators, or intracranial aneurysm clips.

Ferromagnetic metal detectors provide a means to detect ferromagnetic objects. U.S. Pat. No. 7,489,128, issued Feb. 10, 2009 to Kopp, discloses a special type of Ferromagnetic metal detector that is capable of being located at the doorway of an operable MRI apparatus. The apparatus is capable of providing an alarm to help protect personnel from the problem of ferromagnetic objects knowingly or negligently being brought into the MRI magnet room.

However, with over 20,000,000 MRI scans performed in the U.S. annually, the use of a Ferromagnetic metal detector alone may not be sufficient to reduce the occurrence rate of projectile related incidents in the MRI room. Indeed, analysis of the reports in the Food and Drug Administration MAUDE incident reporting data base indicates that the rate of projectile incidents exceeds the rate of increase in the number of MRI scans performed.

An effective technique to reduce the occurrence rates of incidents in the hospital environment and elsewhere is the application of root cause analysis (RCA). RCA was used to analyze the events which led up the previously described incident where a 6 year old boy was killed by an oxygen cylinder. In this incident, there were a number of participants and witnesses to the events leading up to the final tragedy. As a result, there was sufficient data to detail the actions which occurred.

A Blue Ribbon Committee appointed by the American College of Radiology (ACR) made a number of recommendations based, in part, on the RCA of the above incident. The ACR in a White Paper indicated the MRI magnet room should be isolated so that the general public and untrained medical personnel will not have access to the projectile risk associated with the strong magnetic field contained in the MRI magnet room.

This recommendation of limiting access to the MRI magnet room has had a positive affect by reducing inadvertent access to a potentially dangerous area. However an unintended consequence, of the restriction of access to the magnet room area is that an effective RCA cannot be performed since, in many cases there are no impartial witnesses to the sequence of events leading up to the projectile incident. There have been a number of reported incidents where only the victim was present at the time of the incident.

As can be appreciated, continued improvements are needed. For example, it would be beneficial to provide an automatic method to allow the independent documentation of incidents to allow corrective actions as well as RCA to be performed.

BRIEF SUMMARY OF THE INVENTION

The following summary presents a simplified summary in order to provide a basic understanding of some aspects of the arrangements and/or methods discussed herein. This summary is not an extensive overview of the arrangements and/or methods discussed herein. It is not intended to identify key/critical elements or to delineate the scope of such arrangements and/or methods. Its sole purpose is to present some concepts in a simplified form as a prelude to the more detailed description that is presented later.

In accordance with one aspect, the present invention provides an arrangement for association with an operable MRI apparatus located within a room that has an access opening and with the MRI apparatus providing a residual magnetic field that extends to a location of the access opening. The arrangement is also for detecting presence of ferrous material and discriminating out far field magnetic disturbance. The arrangement includes a detector configured to passively monitor the residual magnetic field at the location of the access opening. The detector includes an array of magnetic field sensors arranged about the periphery of the access opening in a spaced arrangement such that each sensor is associated with a different portion of the access opening. The magnetic field changes in response to a presence of ferrous material at the access opening. The magnetic field also changes in response to a far field magnetic disturbance. Each of the sensors is configured to output a signal having a value indicative of the sensed magnetic field at the associated portion of the access opening. The arrangement includes a corrector configured to correct each signal value from the change in response to the far field magnetic disturbance and to provide respective corrected signal values. The arrangement includes a processor configured to use the corrected signal values to determine a ferrous-indicating limit is exceeded and to provide a safety response that addresses the ferrous-indicating limit exceed condition.

BRIEF DESCRIPTION OF THE DRAWINGS

The foregoing and other aspects of the invention will become apparent to those skilled in the art to which the invention relates upon reading the following description with reference to the accompanying drawings, in which.

DETAILED DESCRIPTION OF THE INVENTION

Figure 1:
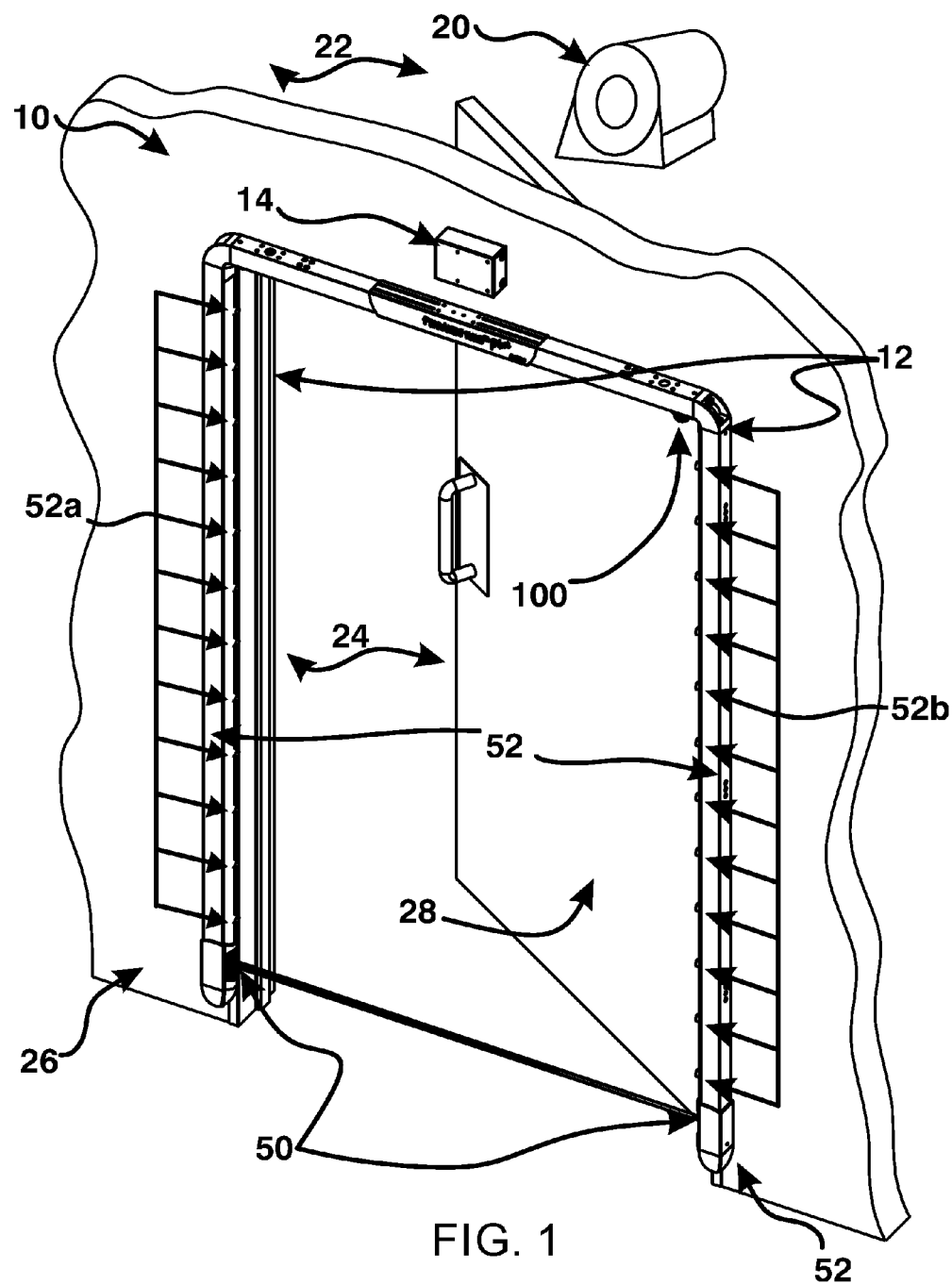
FIG. 1 is a schematic perspective view of an example overall apparatus.

Example embodiments that incorporate one or more aspects of the invention are described and illustrated in the drawings. These illustrated examples are not intended to be a limitation on the invention. For example, one or more aspects of the invention can be utilized in other embodiments and even other types of devices. Moreover, certain terminology is used herein for convenience and ease of identification only and is not to be taken as a limitation on the invention. For example, the terms first, second, etc. are used for convenience and ease of identification only. Still further, in the drawings, the same reference numerals are employed for designating the same elements.

One example of an overall ferromagnetic incident detecting and logging arrangement 10 is a protection arrangement that is schematically shown within FIG. 1 and includes two principal assemblies, which are: a ferromagnetic detector 12 and an incident recording (or the image processor and storage) system 14. In one specific example, the incident recording system 14 is an optical image processor and storage system 14. In one specific example, the ferromagnetic detector 12 can be considered to be an augmented ferromagnetic detector 12 because of new inventive aspect(s) of the ferromagnetic detector 12.

The arrangement 10 is for association with an operable MRI apparatus 20 (represented schematically) located within a room 22 that has an access opening 24 (e.g., a doorway) through one of room-enclosing walls 26 and with the MRI apparatus 20 providing a residual magnetic field that extends to a location of the opening. The access opening 24 (e.g., doorway) is closable via door 28. As will be explained further following, the arrangement 10, and specifically the ferromagnetic detector 12 thereof, is for detecting presence of ferrous material and is also for discriminating out far field magnetic disturbance. As will be explained further following, the arrangement 10, and specifically the image processor and storage system 14 thereof, is for recording or logging information/details (e.g., recording images) concerning incidents of detected presence of ferrous material.

Figure 2:
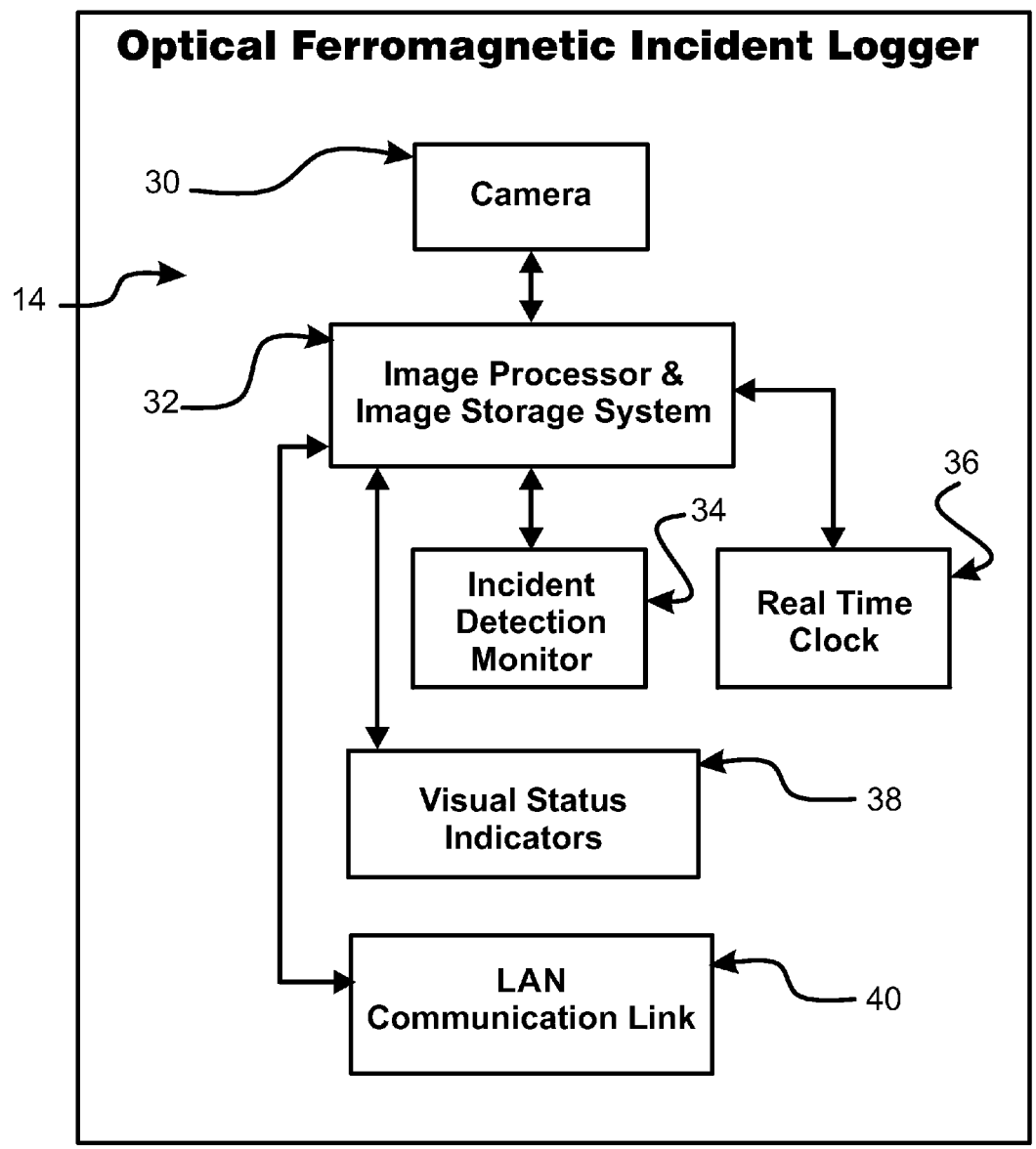
FIG. 2 is a schematic illustration of elements of an example of an optical ferromagnetic image logger for the example apparatus of FIG. 1.

Referring to FIG. 2, one example of the image processor and storage system 14 portion of the arrangement 10 is schematically shown. The example image processor and storage system 14 includes a camera 30 that can image with high resolution at a high frame rate. It is to be appreciated that the camera 30 can have one or more focusing lenses, one or more image capturing elements (e.g., charge coupled device or CCD), memories, or similar, etc. In one specific example, the camera 30 can be equipped with a very wide angle "fish eye" lens and can be mounted in a location with a line of site view of the MRI magnet room 22 as well as the approach to the MRI magnet room via the access opening (e.g., doorway) 24/door 28. In one addition aspect, the camera 30 can be able to view a status indication of the ferromagnetic detector 12.

The camera 30 is operatively connected to an image processor and storage system 32 and is operatively controlled by the image processor and storage system 32. The image processor and storage system 32 can include one or more of: computers or computing devices, processors or processing devices, controllers controlling devices, hard-wired and/or executable programs or the like, and one or more memories, such a RAMs, flash memories, long term memories, or the like. In one example, the image processor and storage system 32, sends a digital command to the camera 30 periodically to take (i.e., capture) an image. For example, an image could be captured every 0.5 seconds. The image processor and storage system 32, stores each image in an image stack of predetermined amount (e.g., "height"). For example, the maximum height of the stack could be 10 images. With a capture rate of 2 images per second, this configuration of the stack could hold 5 seconds worth of images.

When the stack is full, the oldest image is pushed out of the top of the stack (deleted) to allow a new image to be inserted at the bottom of the stack. With this arrangement, in the configuration described, a 5 second history is continuously maintained. Of course, any other amount of image capture and/or image storage could be used.

In addition to capturing an image, the image processor and storage system 32 can convert the images to a format such as JPEG. The image processor and storage system 32 can make adjustments such as contrast, brightness, color depth etc. to optimize image characteristics.

The continuous replenishment of the image stack is interrupted when an incident is detected by an incident detection monitor 34. Within the shown example, the incident detection monitor 34 is operatively connected to the image processor and storage system 32. The incident detection monitor 34 may also be operatively connected to the ferromagnetic detector 12. However, it is possible to configure the arrangement 10 such that the incident detection monitor 34 need not be operatively connected to the ferromagnetic detector 12, via various options of incident detection.

When the incident detection monitor 34, is activated, the image stack is temporarily frozen. No more images are loaded. The image processor and storage system 32 can continue to request the camera to acquire more images. However, such images can be stored within other portions of the image processor and storage system 32 (e.g., within a RAM of the image processor and storage system 32).

In connection with the incident detection monitor 34 being activated, a predetermined number of incident-associated images are acquired and specifically stored. For example, the predetermined number images could be set to 30. If the images are captured every 0.5 seconds, 15 seconds of data is stored. In this example, a total of 20 seconds of data is being held. In one specific example, the specifically stored images could be for 5 seconds before the incident was detected, and 15 seconds after the incident was detected.

Once the full predetermined set of images triggered by an incident has been captured and stored, the image set is stored in a non-volatile memory such as an SD card. The image set can be stored in a unique folder with a date and with a time stamp. The time and date information can obtained from a real time clock 36. Within the shown example, the clock 36 is operatively connected to the image processor and storage system 32. The storage folder as such is tied uniquely to a specific incident which occurred at a specific identified time.

With this arrangement, images capturing the events which lead up to the incidents are captured. For example, if the incident is a person approaching the door with a ferrous object, images of the approach of the person to the door 28 are captured. In addition, the reaction to the incident is also captured. Concerning the example of the person approaching the door 28, if the person logically does not proceed through the door 28 into the room 22 but instead logically retreats away from the door, images of the logical reaction of retreating away from the door are captured.

It is contemplated that the camera 30 and the image processor and storage system 32 are also able to capture and store associated audio. As such, associated audio can be captured and stored concerning/correlating to the captured images of the incident. Also, recall that the camera 30 may be able to also view a status indication of the ferromagnetic detector 12. So, the coincident audio and possibly a visual alarm from the augmented ferromagnetic detector array can also be captured. The number of images captured as well as the time lapse between captured images can be varied as the situation dictates. In like manner, a video stream could also be captured for a period of time before and after the detected incident.

Once the incident image folder has been finalized and stored, the image processor and storage system 32 resumes filling the image stack with new images. The image processor and storage system 32 is re-activated to look for a signal from the incident detection monitor 34.

As mentioned, the incident detection monitor 34 can be operatively coupled to the augmented ferromagnetic detector 12 (FIG. 1). This coupling can take many forms such as acoustic, infrared, WIFI, wired (e.g., serial port), etc. For example, the incident detection monitor 34 could have a piezoelectric sensor tuned the same frequency as an audible/audio (i.e., sound) alarm indication from the augmented ferromagnetic detector 12 so as to provide the operative coupling. In one specific example, the incident detection monitor 34 will respond to an audible/audio indication signal of the tuned frequency and with the specific characteristics of number and duration of beeps from the audible/audio alarm of the augmented ferromagnetic detector 12. This example configuration (i.e., use of audible/audio signal) does not require any physical connection between the portion(s) (e.g., the image processor and storage system 32 and/or the incident detection monitor) of the image processor and storage system 14 and the portion(s) of the ferromagnetic detector 12.

In one example, to allow capturing of events leading up to an incident, the image processor and storage system 14, or at least pertinent portions thereof, should be mounted outside of the MRI room (e.g., on the outside of the wall 26, possibly above/at the doorway 24). However, for outswing MRI room doors, it may be advantageous to have the augmented ferromagnetic detector 12 (FIG. 1), mounted inside the magnet room. As a consequence, communication between the image processor and storage system 14 (FIGS. 1 and 2) and the augmented ferromagnetic detector 12 (FIG. 1) is preferably implemented without wires. Such an implemented without wires (i.e., wireless implementation) may provide for a good level of flexibility of installing/mounting options.

Referring to again FIG. 2, a visual status indicator 38 can be operatively connected to the image processor and storage system 32 within the image processor and storage system 14. The visual status indicator 38 can contain indicators (e.g., lights) which can indicate: that the power is ON, that it is time to download the accumulated image incident folders, that the non-volatile image store memory is nearly full, and/or that the non-volatile image store memory is full. Other indicator functions can also be added.

A LAN communication link 40 can be provided within the image processor and storage system 14. The LAN communication link 40 can allow the data to be accessed for further analysis. This analysis will be described later. Alternatively, the data can be accessed by a USB port, an HDMI port or other communications means. Additionally, a removable SD card or other non-volatile media can be used to gain access to the stored image data.

One specific example ferromagnetic detector 12 that responds to a ferromagnetic incident is the MRI Protector invention described in. U.S. Pat. No. 7,489,128 (European counterpart No. 1482832, Japanese counterpart No. 5,602, 160) which is/are incorporated herein by reference, but with augmentation which allows the invention to capture only incidents and not extraneous ferromagnetic events. It is to be noted that the ferromagnetic detector 12 can include one or more of: computers or computing devices, processors or processing devices, controllers controlling devices, hardwired and/or executable programs or the like, and one or more memories, such a RAMs, flash memories, long term memories, or the like.

Figure 8:
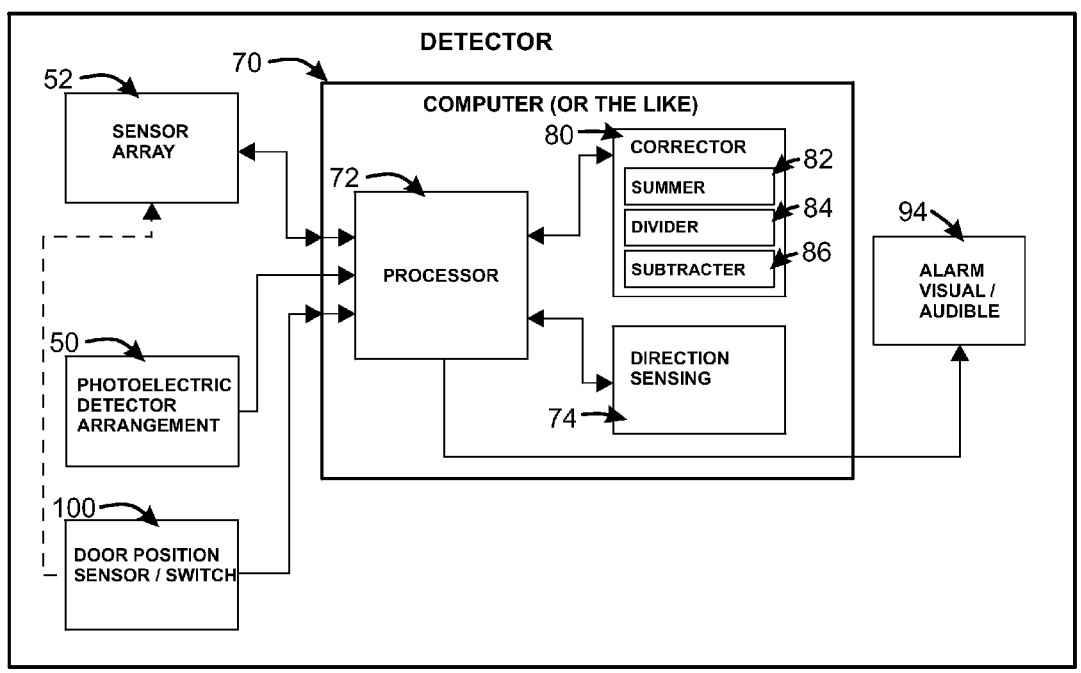
FIG. 8 is a schematic illustration of one example augmented ferromagnetic detector.

It is to be appreciated that there is a distinction between incidents that merit capture (i.e., logging) and extraneous ferromagnetic events that do not merit capture (i.e., logging). There are a number of sources of ferromagnetic events which should be suppressed and not captured/logged, if the recorded image incident data is to be of high quality. The augmentation required to achieve high data quality will now be described. FIG. 8 is a schematic illustration of one example detector 12 of the arrangement 10 that provides for some example augmentations.

In accordance with one inventive aspect, only ferromagnetic objects entering/attempting to enter the MRI room 22 (FIG. 1) should be reported as incidents since these objects pose a projectile threat if present within the MRI room. Ferromagnetic objects leaving the MRI room should not be reported as a threat since the projectile risk diminishes with distance from the MRI magnet. Also, stray influence, such as far field effects from ferromagnetic objects (possible large ferromagnetic objects) that are not entering/attempting to enter the MRI room 22 should not be reported as incidents since these objects do not pose a projectile threat within the MRI room 22.

Referring to FIG. 1, a two-part photoelectric emitter/detector arrangement 50 is mounted in a sensor array 52 of the ferromagnetic detector 12. In the shown example, the photoelectric emitter/detector arrangement 50 is located at/near a bottom of the sensor array 52 of the ferromagnetic detector 12.

Figure 3:
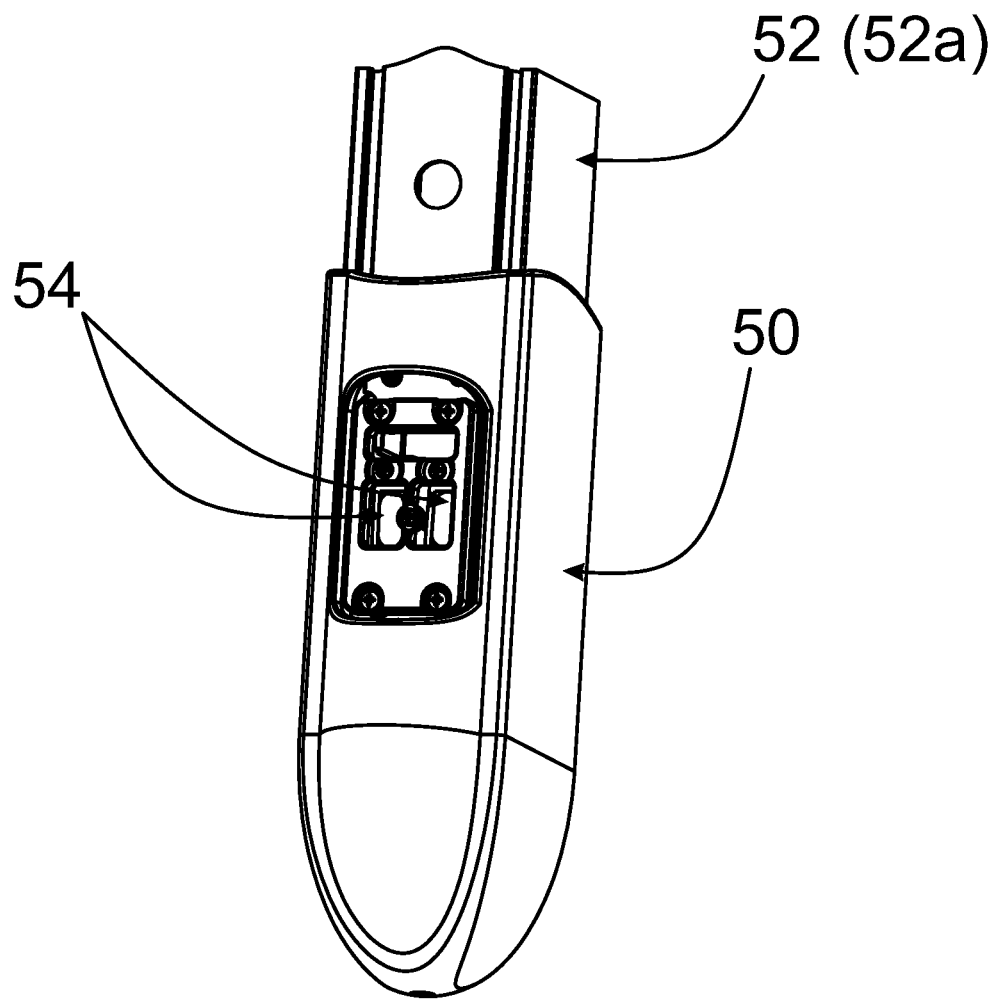
FIG. 3 is an illustration of example details of an example of a dual photoelectric array mounted in an augmented ferromagnetic detector array.

Referring to FIG. 3, an enlarged view of a portion of an example photoelectric emitter/detector arrangement 50 is shown. The example includes two (i.e., a pair) photoelectric emitter-detectors 54. Also, the pair of photoelectric emitter-detectors 54 are mounted in the sensor array 52 (e.g., at a bottom of a first bank 52a of the sensor array 52) for location at one side of the access opening 24.

Figure 4:
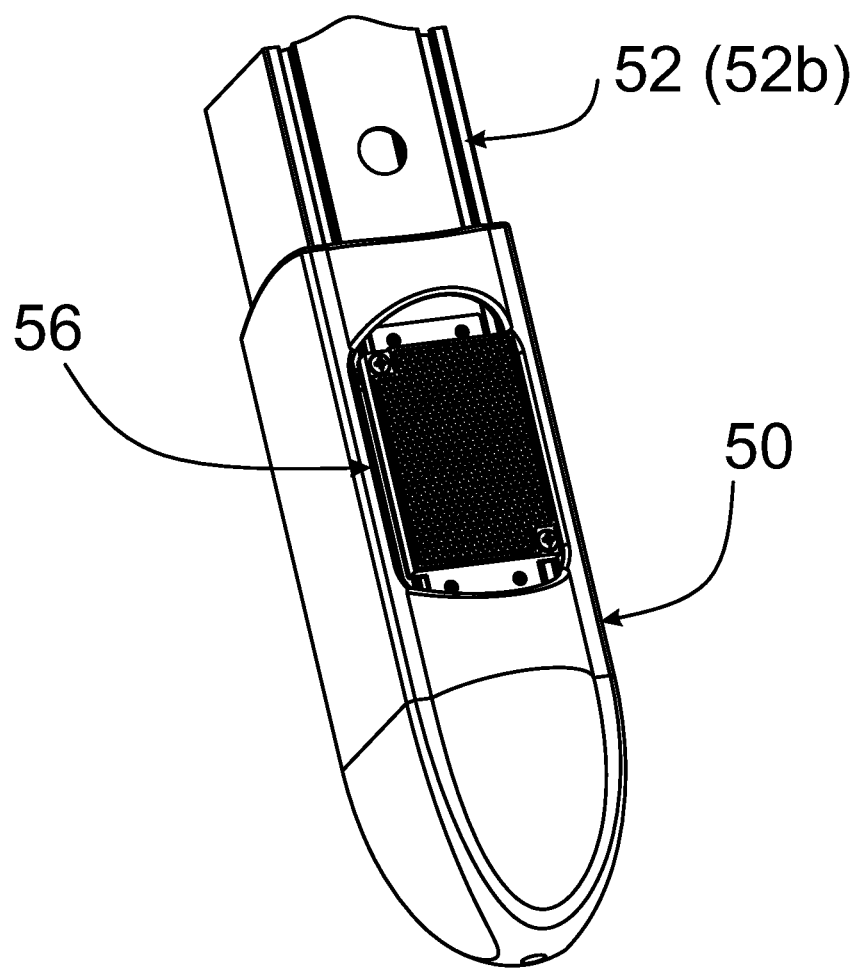
FIG. 4 is an illustration of example details of an example of the photoelectric reflector mounted in the augmented ferromagnetic detector array.

Referring to FIG. 4, a reflector 56, which is a complementary component to the pair photoelectric emitter-detectors 54 shown within FIG. 3, is mounted in the sensor array 52 (e.g., at a bottom of a second bank 52b of the sensor array 52) for location at a second side of the access opening 24.

Figure 5:
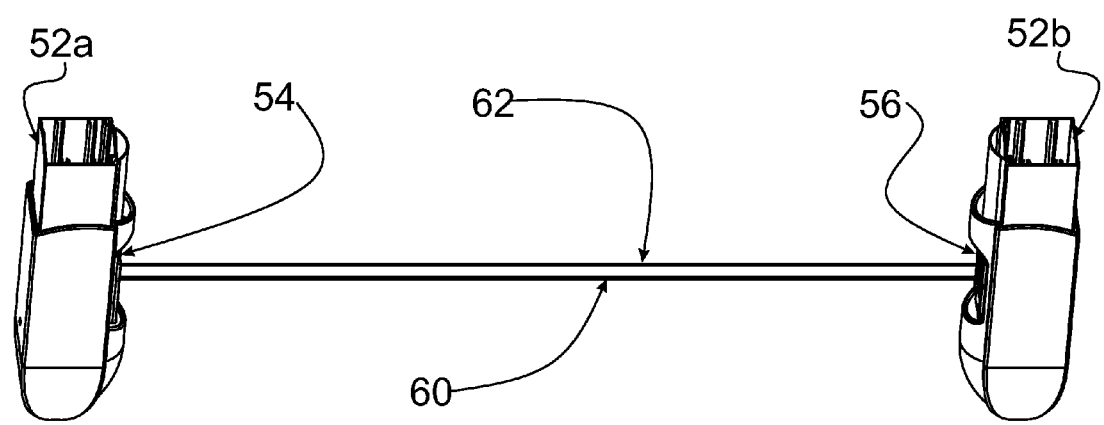
FIG. 5 is an illustration of an example of the dual photoelectric assembly.

FIG. 5 illustrates the complete two-part photoelectric emitter/detector arrangement 50, which has direction sensing capability. The example emitter-receiver detectors 54 are mounted in the first bank 52a of the sensor array 52 and the reflector 56 is mounted in the second bank 52b of sensor array. A photoelectric beam 60/62 is directed from each photoelectric emitter-detector 54 toward the reflector 56, to be reflected back toward the respective photoelectric emitter-detector. Such, photo beam travel only occurs if the respective beam is not interrupted. If the respective beam is interrupted (e.g., via a person or object present/moving into the respective beam path at the access opening 24), such is an indication of a possible incident.

As mentioned, the photoelectric emitter/detector arrangement 50 is associated with direction sensing capability. When an object or person approaches the MRI room, the photoelectric beam 60 further away from the MRI room 22 will be broken first, followed by the photoelectric beam 62 closest to the MRI room being broken. This sequence of events allows the augmented ferromagnetic detector array to look for a ferromagnetic incident and respond; which may be audio and/or visual and/or electrical should a ferromagnetic object pass through the array.

Conversely, if the photoelectric beam 62 closest to the MRI room 22 is broken before the photoelectric beam 60 further away from the MRI room, there will be no incident indication in this event of a ferromagnetic object or person leaving the MRI room.

To ensure that no ferromagnetic incidents are overlooked, in the event of one of the photoelectric beams failure or are misaligned, the remaining photoelectric beam will continue to inhibit incident recording if the remaining beam is not broken. Further, if both beams fail or are misaligned, the augmented ferromagnetic detector array will be continuously active.

FIG. 8 provided a schematic representation of structures, components, functions, etc. that can accomplish the above mentioned direction sensing capability. A computer (or the like) 70 of the detector 12 receives signals from the photoelectric emitter/detector arrangement 50. A processor 72 and/or a direction sensing component/function/program 74 of the computer 70 process information provided by the signals from the photoelectric emitter/detector arrangement 50 to make the above mentioned directionality determinations. Also, the computer 70, and the processor 72 thereof, utilized the above mentioned directionality determinations.

Figure 6:
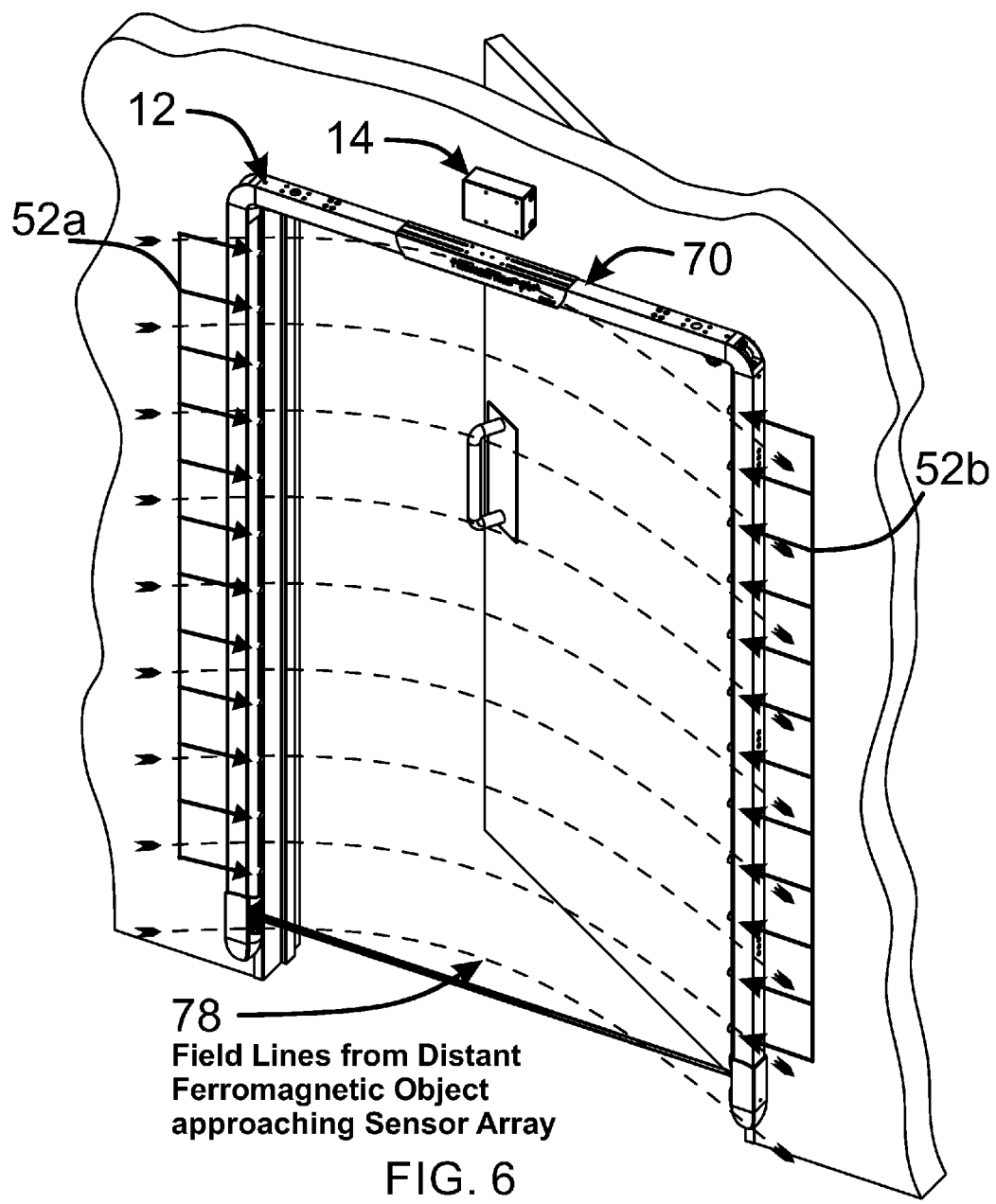
FIG. 6 is an illustration that presents an example of a magnetic field line disturbance from a distant ferromagnetic object.

In order to reduce responding to large ferromagnetic objects that are at a significant distance from the MRI room and as such pose no threat to the room (i.e., a far-field activity), a special far field cancelling function/scheme is implemented in the augmented ferromagnetic detector 12. This cancelling function/scheme is a correction, in that the correction is to correctly assess potential threats. An example of component/function/program for providing such correction is shown within the example detector of FIG. 8. The effect and the implementation of this scheme are illustrated in FIG. 6.

A large object at a significant distance from the augmented ferromagnetic detector array will produce a nearly identical effect on all (e.g., 12 within the shown example) magnetic sensors in the left bank 52a. This uniform magnetic field disturbance is indicated by the equally spaced dashed lines 78. Also, a nearly identical effect, but potentially a little different from the effect upon left bank 52a, will be produced in all (e.g., 12 within the shown example) magnetic sensors in right bank 52b. The computer 70 and/or the processor 72, etc. within the augmented ferromagnetic detector 12 provides the correction. With the shown example, the computer has a corrector 80. The corrector 80, and portions therein, can be hard-wired components, an executable program possibly performed by the processor 72, etc. Within the corrector 80, a summer 82 sums the signal values from each of the sensors in a bank (e.g., 52a). Also within the corrector 80, a divider 84 divides the sum value by the number of sensors in the bank (e.g., 52a, in this case divide by 12). Such division provides an average. Still further within the corrector 80, a subtracter 86 subtracts the average from each signal value so as to remove an average from each signal value. So, the computer 70, processor 72, etc. within the augmented ferromagnetic detector 12 has structured component(s), program(s), etc. that provide the summation of the signal values and (e.g., the summer 82) within the augmented ferromagnetic detector 12. This calculated value for each sensor bank will be subtracted from each of the sensor signal output of the respective sensor bank before the computer determines whether an alarm condition is present. This calculation removes the effect of a far field magnetic disturbance of an object at a significant distance and as a result, no alarm event is triggered for the object at a significant distance.

Figure 7:
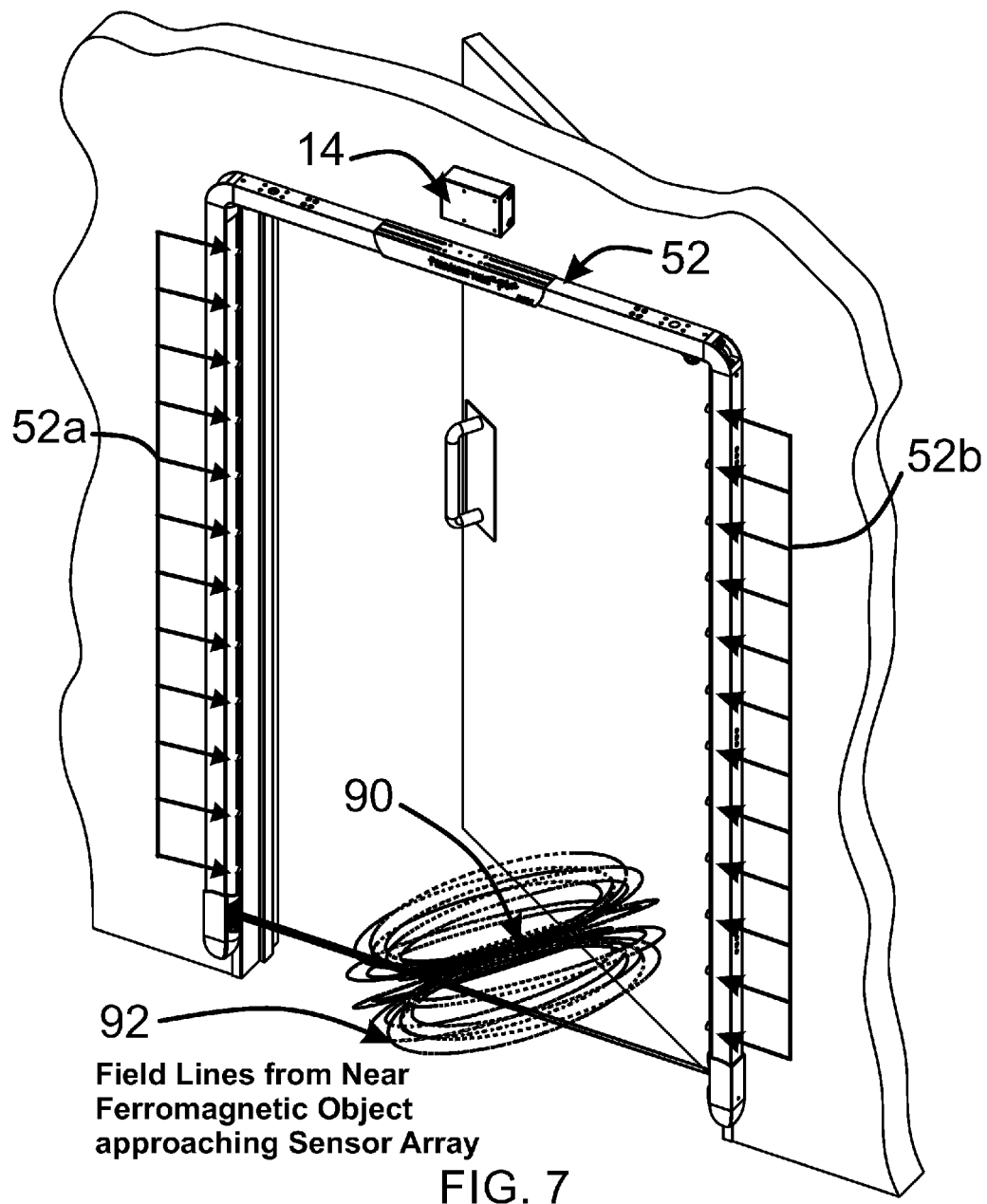
FIG. 7 is an illustration that presents an example of a magnetic field line disturbance from a near ferromagnetic object.

Referring to FIG. 7, a ferromagnetic object 90 passing through the ferromagnetic sensor array 52 (e.g., passing banks 52a, 52b) will produce a very localized magnetic field disturbance effect. This effect is illustrated by the cluster of magnetic field lines 92 shown near the bottom of the sensor array 52. All of the magnetic sensors of both banks 52a and 52b, will experience at least some effect from the near field object 90. However, the effect of a nearby ferromagnetic object decreases at approximately the cube of the distance. As a result only sensors near the object 90 will be subjected to a much more significant disturbance than the sensors further away from the object 90. The resulting far field calculation described in the paragraph above does not produce a meaningful reduction of the magnetic disturbance signal of the sensors near the object 90. As a result, if the ferromagnetic object produces a signal above the preset alarm value, the object will trigger an alarm 94 (see FIG. 8) and as such will generate a ferromagnetic incident. It is to be appreciated that the alarm 94 can include one or more portions that provide an audible alarm indication and/or a visible alarm indication. Portion(s) that provide the visible alarm indication may be located adjacent/along the extent of the sensor array 52 (e.g., adjacent/along the sensor banks 52a, 52b). It is to be recalled that the incident detection monitor 34 could have a piezoelectric sensor tuned the same frequency as the audible alarm.

Another source of magnetic disturbance which is indicative of a ferromagnetic event is the opening (or closing) of the MRI room door. Referring to FIG. 1, the door 28 to the MRI room 22 is shown swinging into the MRI room. This door 28 is part of the RF shielding of all operational MRI machines. As a consequence, the door is electrically conductive. Further, many doors contain ferromagnetic material such as dead bolt locks, hinges and other structural members.

As personnel attempt to enter the MRI room 22, the door 28 will begin to move and the photoelectric beam(s) 60, 62 will be broken. Since the act of opening the door 28 will move the door though the magnetic spatial gradient generated by the MRI magnet, an eddy current will be produced in the door. This eddy current will produce a magnetic field. The eddy current magnetic field will be detected by the augmented ferromagnetic detector 12 and could trigger the alarm 94. This alarm indication could occur whether the personnel entering the room are carrying ferromagnetic material or not. As a consequence, the resulting alarm indication does not provide useful information as to the ferromagnetic status of the personnel entering the MRI room.

The augmented ferromagnetic detector array incorporates a door position sensor 100. This sensor 100 can be of a variety of types such as a mechanical limit switch, a photoelectric proximity switch or many other types. The sensor 100 detects when the door 28 begins to move. When door 28 movement is detected, the computer 70, and/or components therein, of the augmented ferromagnetic detector 12, no longer analyzes the signals from the magnetic sensor banks 52a and 52a. Such can be accomplished via specific component(s) of the computer, hard-wired processing, program processing, or the like. Instead analysis of the signals from the magnetic sensor banks 52a and 52a, the computer 70 reviews the scans of the sensor banks immediately preceding the door position sensor detected door movement to determine whether the approaching person or object had ferromagnetic content sufficient to trigger an alarm. If the ferromagnetic content is sufficient to trigger an alarm indication, the alarm 94 will be activated and a ferromagnetic incident will be recorded when the dual photoelectric beam 60, 62 is broken.

Alternatively, if the personnel or object approaching the door is totally non-ferromagnetic, or has less than the trigger level of ferromagnetic material, no alarm will be activated and no ferromagnetic incident will be recorded.

In this situation, the computer will once again detect that the door is being opened from the door position sensor 100. The signals from the magnetic sensor banks 52a and 52b will be ignored once motion is detected from the door position sensor 100. The computer will again analyze the magnetic sensor data from the sensor banks 52a and 52b and determine there was no significant magnetic disturbance immediately before the commencement of the door opening. The computer 70 can be programmed (component/hard-wired configured) to not generate an alarm indication under these circumstances. As a result, in this situation, no ferromagnetic incident will be logged even though the movement of the MRI room door likely generated a significant magnetic disturbance.

In the case of the MRI door swinging away from the MRI room, the door position switch 100 can serve two functions. The first function being the above mentioned sensor function and the second function being a switch to remove power from the entire array when the MRI room door is closed (see dashed control line within FIG. 8 extending from the door position sensor/switch 100 to the sensor array 52. This is desirable since for outswing doors, the augmented ferromagnetic detector array is typically mounted inside of the MRI room. Removing power assures that there is no possibility of interference with the imaging process.

The door position sensor/switch 100 also allows the MRI door movement to be ignored and as such, the resultant alarm indication potential is eliminated. However, if there is ingress by an object or personnel while the MRI door is moving, an alarm will sound and an incident will be recorded since this would be a violation of established protocol.

Referring to FIG. 2, the visual status indicator 38 provides information as to whether the power is ON. The indicator 38 also alerts staff that it is time to perform the periodic download of the incident image folders. Indicators are also provided to alert staff that the memory containing the incident image folders are nearly full or that the memory is full.

The incident image folder data can be downloaded through a USB port, an HDMI port or other communications means. A preferred method to download the data uses an Ethernet connection to the healthcare facilities local area network 40. With this method a host computer can automatically download the data from the ferromagnetic incident logging manager at will. The data can then be processed to provide information regarding ferromagnetic incident trends. The data can be further analyzed to perform a Root Cause Analysis if appropriate.

The apparatus described above logs ferromagnetic material attempting entry into the MRI room. Yet ferromagnetic disturbances which do not pose a projectile threat are not logged. The apparatus described above is representative of a preferred implementation of the invention. However there are many variations that could be realized by someone trained in the art.

So, as discussed above, the follow are some example aspects. An arrangement for association with an operable MRI apparatus located within a room that has an access opening and with the MRI apparatus providing a residual magnetic field that extends to a location of the opening. The arrangement is also for detecting presence of ferrous material and discriminating out far field magnetic disturbance. The arrangement includes a detector configured to passively monitor the residual magnetic field at the location of the opening. The detector includes an array of magnetic field sensors arranged about the periphery of the opening in a spaced arrangement such that each sensor is associated with a different portion of the access opening. The magnetic field changes in response to a presence of ferrous material at the opening. The magnetic field also changes in response to a far field magnetic disturbance. Each of the sensors is configured to output a signal having a value indicative of the sensed magnetic field at the associated portion of the access opening. The arrangement includes a corrector configured to correct each signal value from the change in response to the far field magnetic disturbance and to provide respective corrected signal values. The arrangement includes a processor configured to use the corrected signal values to determine a ferrous-indicating limit is exceeded and to provide a safety response that addresses the ferrous-indicating limit exceed condition.

As another aspect, the arrangement further including a recording system configured to record incident information associated with a determination that a ferrous-indicating limit is exceeded. As another aspect, the recording system including a portion configured to record an image of the location of the access opening associated with a determination that a ferrous-indicating limit is exceeded. As another aspect, the processor is configured to determine whether an incident occurs upon the ferrous-indicating limit being exceeded and the recording system includes an incident detection monitor configured to cause the recording system to record the incident information upon the processor determining an incident occurrence.

As another aspect, wherein the detector includes an alarm configured to provide an alarm indication in response to the processor providing the safety response, and the recording system includes a camera configured to capture of an image area that includes the location of the access opening and a least a portion of the alarm that provides the alarm indication. As another aspect, the recording system is operatively coupled to the detector.

As another aspect, the detector includes an alarm configured to provide an audible alarm indication in response to the processor providing the safety response, and the recording system for recording system is operatively coupled to the alarm. As another aspect, the operative coupling between the alarm and the recording system is an audible sound coupling.

As another aspect, the corrector includes: a summer configured to sum all of signal values to provide a summed value, a divider configured to divide the summed value by a total number of the magnetic field sensors to provide an average signal value, and a subtracter configured to subtract the average value respectively from each signal values to provide the respective corrected signal values.

As another aspect, the access opening is a doorway having a movable door thereat, the arrangement including a direction sensing arrangement configured to determine movement direction of the door. As another aspect, the processor is configured to modifying the safety response as a function of the determined movement direction of the door. As another aspect, the direction sensing arrangement includes at least one photoelectric emitter-detector device.

As another aspect, the access opening permits movement of an object there through, the arrangement including a direction sensing arrangement configured to determine movement direction of the object. As another aspect, the processor is configured to modifying the safety response as a function of the determined movement direction of the object. As another aspect, the direction sensing arrangement includes at least one photoelectric emitter-detector device. As another aspect, the object is a person.

As another aspect, the access opening permits an object to be present at the access opening, the arrangement including a presence sensing arrangement configured to determine presence of the object at the access opening. As another aspect, the processor is configured to modifying the safety response as a function of the determined presence of the object. As another aspect, the presence sensing arrangement includes at least one photoelectric emitter-detector device. As another aspect, the object is a person.

As some other aspects, the following are provided: a magnetic resonance compatible apparatus capable of detecting and recording the occurrence of ferromagnetic objects entering the MRI room. The apparatus includes an optical ferromagnetic incident logger and an augmented ferromagnetic detector array. The optical ferromagnetic incident logger is activated by the specially augmented ferromagnetic detector array when a ferromagnetic object attempts to enter the MRI magnet room and visually records images immediately before the attempted entry as well as immediately after the incident.

As another aspect, the optical ferromagnetic image logger has a continuously updated historical image stack. As another aspect, the optical ferromagnetic image logger captures images before and after a ferromagnetic incident is detected. As another aspect, the optical ferromagnetic image logger captures images on the approach to the MRI door and after passing through the doorway of the MRI doorway. As another aspect, the optical ferromagnetic image logger communicates with and captures a ferromagnetic incident from the augmented ferromagnetic detector array. As another aspect, the incident image set is stored in a date and time stamped electronic folder.

As another aspect, the optical ferromagnetic image logger provides an output through a local area network or other communication link to periodically download and analyze the visual incident history. As another aspect, the augmented ferromagnetic detector array suppresses potential alarms from objects at a significant distance by ignoring the common mode signal on each bank of sensors. As another aspect, there is a use of dual photoelectric beams to suppress incident logging from personnel or objects leaving the MRI room. As another aspect, the augmented ferromagnetic detector array incorporates a door position switch which provides for the suppression of the detected ferromagnetic disturbance from the moving MRI door but allows the detection of a person or object approaching and opening the MRI door. As another aspect, there is a method associated with a magnetic resonance compatible apparatus as described herein.

Of course, the presented examples are to be considered to be examples and are not to be considered as limitations. Other, different, possibly more complicated examples are contemplated and are to be considered to be within the scope of the invention.

The invention has been described with reference to the example embodiments described above. Modifications and alterations will occur to others upon a reading and understanding of this specification. Example embodiments incorporating one or more aspects of the invention are intended to include all such modifications and alterations insofar as they come within the scope of the appended claims.

What is claimed:

1. An arrangement for association with an operable MRI apparatus located within a room that has an access opening and with the MRI apparatus providing a residual magnetic field that extends to a location of the access opening, and for detecting presence of ferrous material and discriminating out far field magnetic disturbance, the arrangement including:
   a detector configured to passively monitor the residual magnetic field at the location of the access opening, the detector including an array of magnetic field sensors arranged about the periphery of the access opening in a spaced arrangement such that each sensor is associated with a different portion of the access opening, the magnetic field changing in response to a presence of ferrous material at the access opening, the magnetic field also changing in response to a far field magnetic disturbance, each of the sensors being configured to output a signal having a value indicative of the sensed magnetic field at the associated portion of the access opening;
   a corrector configured to correct each signal value from the change in response to the far field magnetic disturbance and to provide respective corrected signal values; and
   a processor configured to use the corrected signal values to determine a ferrous-indicating limit is exceeded and to provide a safety response that addresses the ferrous-indicating limit exceed condition.

2. An arrangement as set forth in claim 1, the arrangement further including a recording system configured to record incident information associated with a determination that a ferrous-indicating limit is exceeded.

3. An arrangement as set forth in claim 2, wherein the recording system including a portion configured to record an image of the location of the access opening associated with a determination that a ferrous-indicating limit is exceeded.

4. An arrangement as set forth in claim 2, wherein the processor is configured to determine whether an incident occurs upon the ferrous-indicating limit being exceeded and the recording system includes an incident detection monitor configured to cause the recording system to record the incident information upon the processor determining an incident occurrence.

5. An arrangement as set forth in claim 2, wherein the detector includes an alarm configured to provide an alarm indication in response to the processor providing the safety response, and the recording system includes a camera configured to capture an image area that includes the location of the access opening and at least a portion of the alarm that provides the alarm indication.

6. An arrangement as set forth in claim 2, wherein the recording system is operatively coupled to the detector.

7. An arrangement as set forth in claim 6, wherein the detector includes an alarm configured to provide an audible alarm indication in response to the processor providing the safety response, and the recording system for recording system is operatively coupled to the alarm.

8. An arrangement as set forth in claim 7, wherein the operative coupling between the alarm and the recording system is an audible sound coupling.

9. An arrangement as set forth in 1, wherein the corrector includes: a summer configured to sum all of signal values to provide a summed value, a divider configured to divide the summed value by a total number of the magnetic field sensors to provide an average signal value, and a subtracter configured to subtract the average value respectively from each signal values to provide the respective corrected signal values.

10. An arrangement as set forth in 1, wherein the access opening is a doorway having a movable door thereat, the arrangement including a direction sensing arrangement configured to determine movement direction of the door.

11. An arrangement as set forth in 10, wherein the processor is configured to modifying the safety response as a function of the determined movement direction of the door.

12. An arrangement as set forth in 10, wherein the direction sensing arrangement includes at least one photo-electric emitter-detector device.

13. An arrangement as set forth in 1, wherein the access opening permits movement of an object there through, the arrangement including a direction sensing arrangement configured to determine movement direction of the object.

14. An arrangement as set forth in 13, wherein the processor is configured to modifying the safety response as a function of the determined movement direction of the object.

15. An arrangement as set forth in 13, wherein the direction sensing arrangement includes at least one photo-electric emitter-detector device.

16. An arrangement as set forth in 13, wherein the object is a person.

17. An arrangement as set forth in 1, wherein the access opening permits an object to be present at the access opening, the arrangement including a presence sensing arrangement configured to determine presence of the object at the access opening.

18. An arrangement as set forth in 17, wherein the processor is configured to modifying the safety response as a function of the determined presence of the object.

19. An arrangement as set forth in 17, wherein the presence sensing arrangement includes at least one photo-electric emitter-detector device.

20. An arrangement as set forth in 17, wherein the object is a person.

* * * * *